United States Patent [19]

Bonora

[11] Patent Number: 4,674,936
[45] Date of Patent: Jun. 23, 1987

[54] SHORT ARM MANIPULATOR FOR STANDARD MECHANICAL INTERFACE APPARATUS

[75] Inventor: Anthony C. Bonora, Menlo Park, Calif.

[73] Assignee: Asyst Technologies, Milpitas, Calif.

[21] Appl. No.: 769,850

[22] Filed: Aug. 26, 1985

[51] Int. Cl.[4] ............................................. B65G 65/00
[52] U.S. Cl. ................................... 414/217; 414/608; 414/618; 414/733; 414/742
[58] Field of Search ............... 414/217, 221, 222, 225, 414/287, 733, 734, 589, 226, 592, 618, 742, 787, 331, 608; 901/18

[56] References Cited

U.S. PATENT DOCUMENTS

| | | | |
|---|---|---|---|
| 2,914,203 | 11/1959 | Gafner | 414/734 |
| 3,187,917 | 6/1965 | Miller | 414/664 |
| 4,336,423 | 12/1982 | Inaba et al. | 901/17 X |
| 4,336,438 | 6/1982 | Uehara et al. | 414/222 X |
| 4,343,584 | 8/1982 | Hudgins | 414/222 |
| 4,412,771 | 11/1983 | Gerlach et al. | 414/217 |
| 4,518,298 | 5/1985 | Yasukawa | 414/589 X |
| 4,532,970 | 8/1985 | Tullis et al. | 220/20.5 X |

*Primary Examiner*—Robert J. Spar
*Assistant Examiner*—Stuart J. Millman
*Attorney, Agent, or Firm*—Fliesler, Dubb, Meyer & Lovejoy

[57] ABSTRACT

Disclosed is a manipulator for removing a cassette holding articles, such as semiconductor wafers, to be processed from a container supported on a processing station in a standard mechanical interface (SMIF) system. The container is supported on an interface port on the canopy of the processing station. A first platform is transportable along a shaft below the interface port. The platform is operable to mate with the interface port and receive the cassette from the container. The first platform is transported down the shaft, thereby removing the cassette from the container. An arm orthogonal to the shaft and mounted in the shaft supports a pivoting arm which swings to engage the cassette on the first platform and support the cassette off of the first platform. The pivoting arm pivots to transport the cassette to a location away from the shaft. The first platform is then transported back up the shaft to the interface port to seal the container to prevent particulate contamination. The pivot arm then pivots to swing the cassette to a host elevator which is located in alignment with the shaft below the first platform.

20 Claims, 8 Drawing Figures

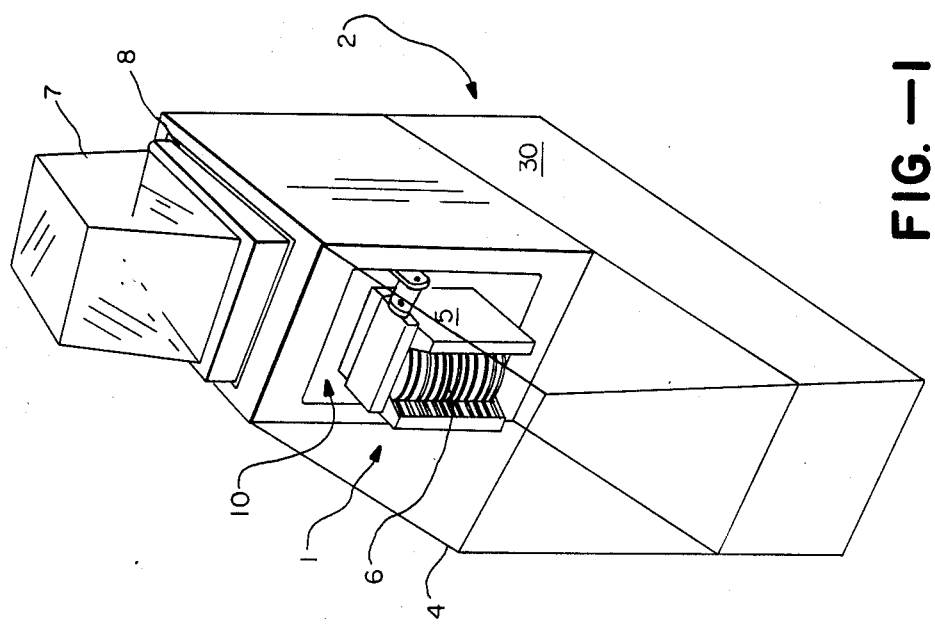
FIG. —1
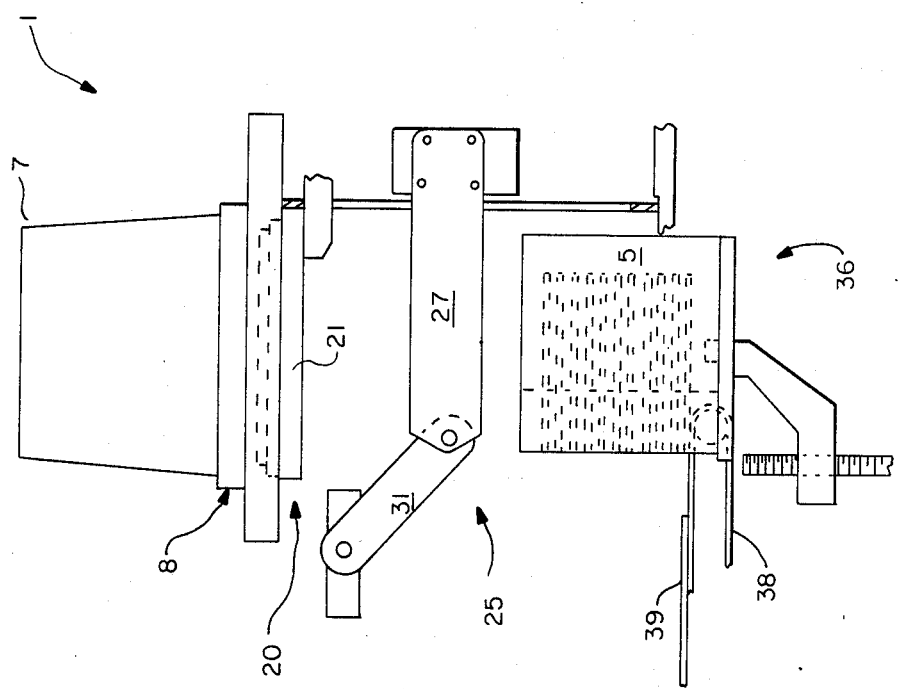
FIG. —6

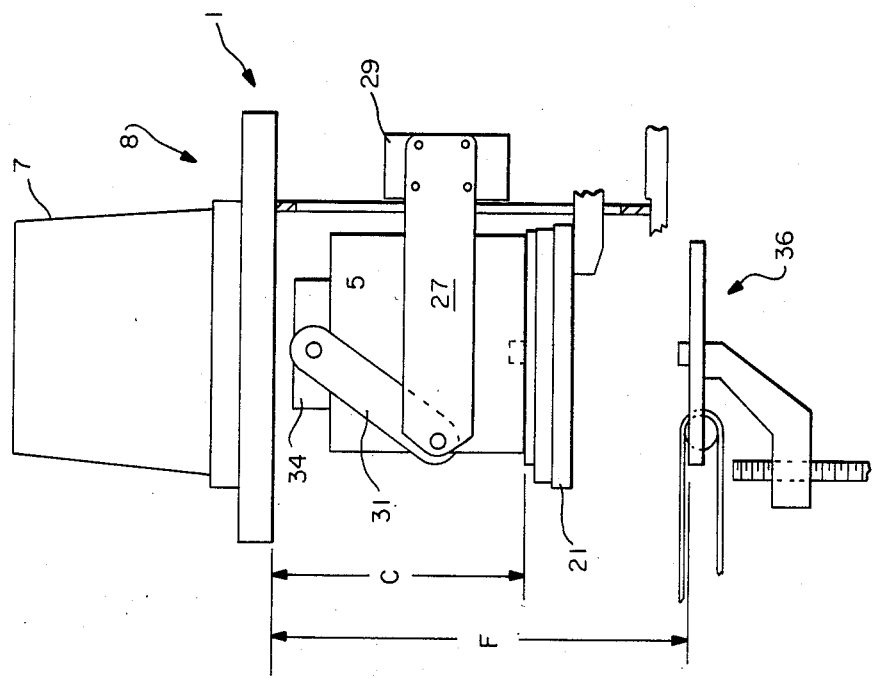
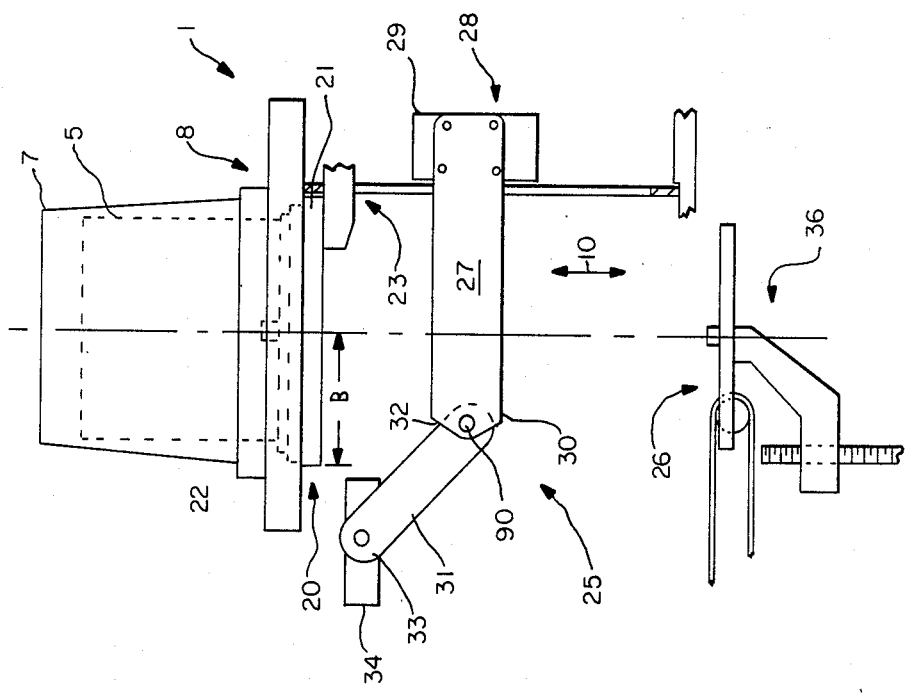

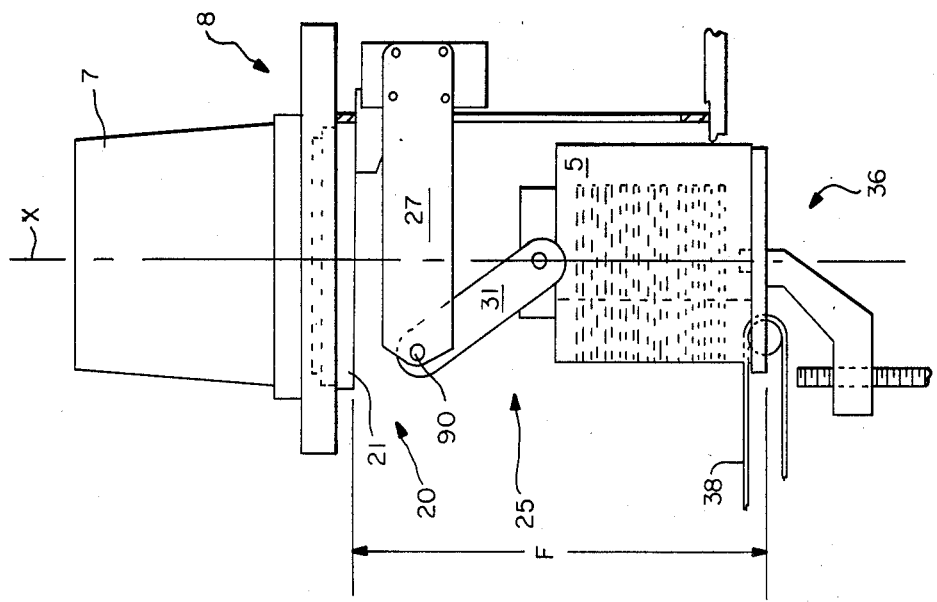
FIG.—5
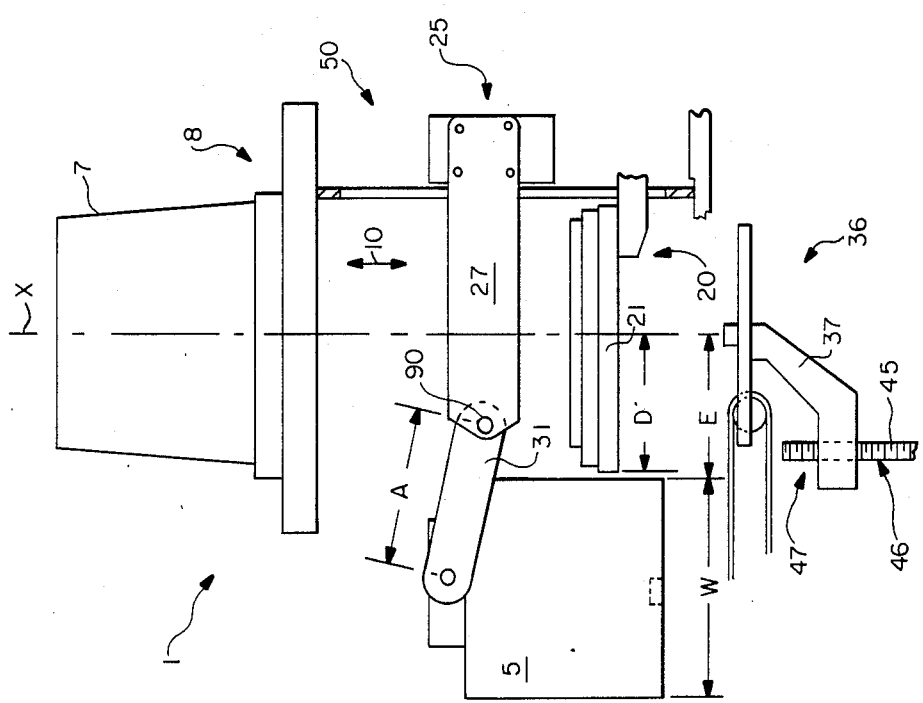
FIG.—4

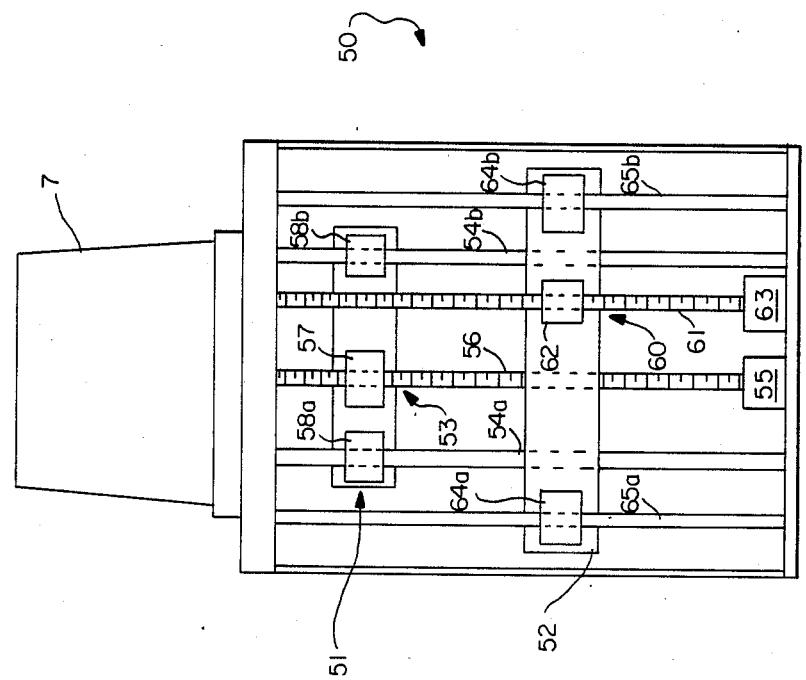
FIG.—8
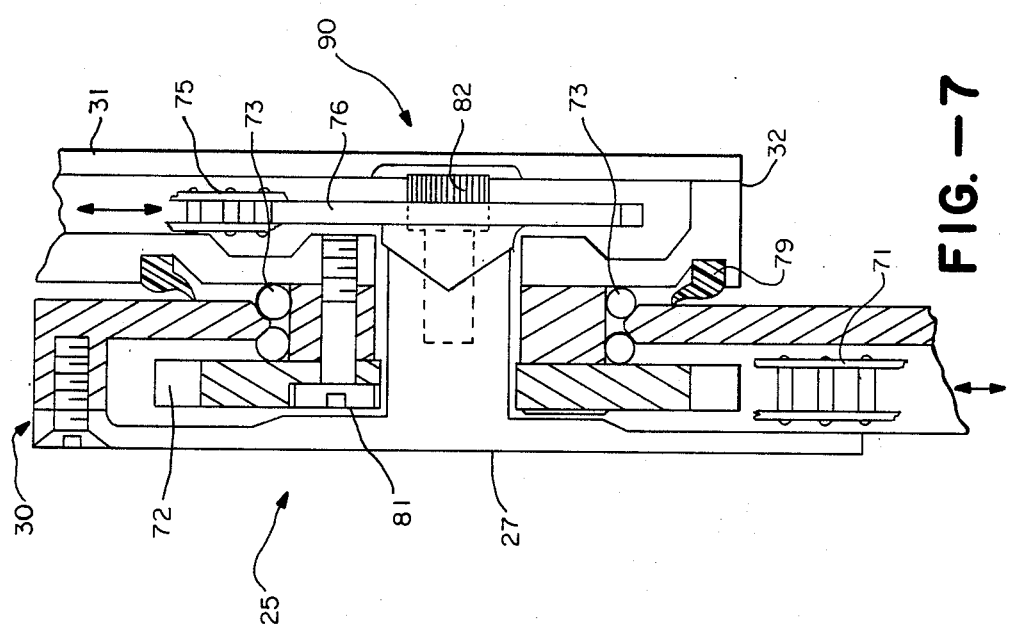
FIG.—7

SHORT ARM MANIPULATOR FOR STANDARD MECHANICAL INTERFACE APPARATUS

CROSS REFERENCE TO RELATED APPLICATIONS

The following commonly assigned applications relate in general to the field of standardized mechanical interface systems:

SEALED STANDARD INTERFACE APPARATUS; Inventors: George Allen Maney, Andrew William O'Sullivan, W. George Faraco; Ser. No.: 635,384; Filed: July 30, 1984.

BOX DOOR ACTUATED RETAINER; Inventors: George Allen Maney, Andrew William O'Sullivan, W. George Faraco; Ser. No. 686,443; Filed: Dec. 24, 1984.

LONG ARM MANIPULATOR FOR SEALED STANDARD INTERFACE APPARATUS; Inventors: Anthony Charles Bonora and Andrew William O'Sullivan; Ser. No. 769,709; Filed Aug. 26, 1985.

BACKGROUND OF THE INVENTION

The present invention relates to manipulating apparatus for standardized mechanical interface systems for reducing particle contamination and more particularly to apparatus transferring cassettes containing articles to be processed into and out of sealed containers suitable for use in semiconductor processing equipment to prevent particle contamination.

A standardized mechanical interface (SMIF) apparatus has been proposed to reduce particle contamination by significantly reducing particle fluxes onto wafers. This end is accomplished by mechanically ensuring that during transport, storage and processing of the wafers, the gaseous media (such as air or nitrogen) surrounding the wafers is essentially stationary relative to the wafers and by ensuring that particles from the ambient outside environment do not enter the immediate internal wafer environment.

Control of particulate contamination is imperative for cost effective, high-yielding and profitable manufacturing of VLSI circuits. Because design rules increasingly call for smaller and smaller lines and spaces, it is necessary to exert greater and greater control on the number of particles and to remove particles with smaller and smaller diameters.

Some contamination particles cause process defects, such as imcomplete etching in spaces between lines leading to an unwanted electrical bridge. In addition to such physical process defects, other contamination particles may cause electrical failure due to induced ionization or trapping centers in gate dielectrics or junctions.

Modern processing equipment must be concerned with particle sizes which range from below 0.01 micrometers to above 200 micrometers. Particles with these sizes can be very damaging in semiconductor processing. Typical semi-conductor processes today employ geometries which are 1 micrometer and under. Unwanted contamination particles which have geometries measuring greater than 0.1 micrometer substantially interfere with 1 micrometer geometry semiconductor devices. The trend, of course, is to have smaller and smaller semiconductor processing geometries.

In typical processing environments today, "clean rooms" are established in which, through filtering and other techniques, attempts are made to remove particles having geometries of 0.03 micrometer and above. There is a need, however, to improve the processing environment. The conventional "clean room" cannot be maintained as particle free as desired. It is virtually impossible to maintain conventional clean rooms free of particles of a 0.01 micrometer size and below.

The main souces of particulate contamination are personnel, equipment, and chemicals. Particles given off by personnel are transmitted through the environment and through physical contact or migration onto the wafer surface. People, by shedding of skin flakes, for example, are a significant source of particles that are easily ionized and cause defects. Although clean room garments reduce particle emissions they do not fully contain the emissions. It has been found that as many as 6000 particles per minute are emitted into an adjacent one cubic foot of space by a fully suited operator.

To control contamination particles, the trend in the industry is to build more elaborate and expensive clean rooms with HEPA and ULPA recirculating air systems. Filter efficiencies of 99.999% and up to ten complete air exchanges per minute are required to obtain an acceptable level of cleanliness.

To minimize process defects, processing equipment manufacturers must prevent machine generated particles from reaching the wafers, and suppliers of gases and liquid chemicals must deliver cleaner products. Most important, a system must be designed that will effectively isolate wafers from particles during storage, transport and transfer into processing equipment. The Standard Mechanical Interface (SMIF) system has been proposed to achieve this goal. The SMIF concept is based on the realization that a small volume of still, particle-free air, with no internal source of particles, is the cleanest possible environment for wafers. Further details of one proposed system are described in the article "SMIF: A TECHNOLOGY FOR WAFER CASSETTE TRANSFER IN VLSI MANUFACTURING", by Mihir Parikh and Ulrich Kaempf, *Solid State Technology*, July 1984, pp. 111-115 and in the above cross-referenced applications.

The proposed SMIF system has three main components, namely, (1) minimum volume, dustproof containers are used for storing and transporting wafer cassettes; (2) canopies are placed over cassette ports of processing equipment so that the environment inside the containers and canopies become miniature clean spaces; (3) doors on the containers are designed to mate with doors on the cassette ports on the equipment canopies and the two doors are opened simultaneously so that particles which may have been on the external door surfaces are trapped ("sandwiched") between the doors.

In the proposed SMIF system, a container is placed at the cassette port on top of the canopy; latches release the container door and the canopy port door simultaneously. A mechanical elevator lowers the two doors, with the cassette riding on top, into the canopy covered space. A manipulator picks up the cassette and places it onto the cassette port/elevator or other location within the canopy of the equipment. After processing, the reverse operation takes place.

The SMIF system has been proved effective by experiments using prototype SMIF components both inside and outside a clean room. The SMIF configuration achieved a tenfold improvement over the conventional handling of open cassettes inside the clean room.

However, due to the restrictive space within the canopy of the processing station, the size and configuration of the elevators and manipulators within the canopy must be restricted. Furthermore it is desirable that the equipment for removing the cassette holding articles to be processed from the standard mechanical interface container and resealing the container be confined to a small space when not in use in order to maximize the freedom of manipulation of the cassette within the limited spaced under the canopy of the processing station.

SUMMARY OF THE INVENTION

The present invention is a manipulator for transferring a cassette, holding articles to be processed, to and from a container supported at a processing station. The processing station has a cassette port for receiving the cassette when the cassette moves along a central axis extending from outside the processing station, through the cassette port, and into the processing station. A platform for supporting the cassette is transportable along the axis for transferring the cassette to and from the container along the central axis. A manipulator is provided for transferring the cassette to and from the central axis to a location offset from the axis whereby the platform can travel along the axis past the cassette in a bypassing relation.

The manipulator includes two arms in an arrangement having a pivot for the first arm located between the central axis and an offset from the axis at the end of the platform. The first pivot arm length together with the location of the pivot point establishes a mechanism which minimizes the height required in order to have the co-axial loading and unloading, in a bypassing relationship, of the cassette from and to the platform.

The present invention minimizes the amount of height required in which to co-axially load and unload a cassette from the container. This feature is particularly useful when the present invention is adpated to SMIF processing apparatus in a clean room environment where the vertical dimension needs to be small.

Additional objects and features of the invention will appear from the following description in which the preferred embodiments of the invention have been set forth in detail in conjunction with the drawings.

BRIEF DESCRIPTION OF THE DRAWINGS

FIG. 1 is a perspective view of the manipulator according to the present invention with a simplified depiction of a processing station.

FIG. 2 through FIG. 6 are side view drawings of the manipulator according to the present invention used in description of the manipulation of a cassette holding articles to be processed from a container into the processing station.

FIG. 7 is a cross-sectional view of the pivot joint for the pivoting arm of the present invention.

FIG. 8 is a backview of the manipulator according to the present invention showing a means for transporting the platforms along the shaft.

DETAILED DESCRIPTION

With reference to the Figures, a detailed description of a preferred embodiment for the present invention is described.

FIG. 1 shows a perspective view of manipulator 1 according to the present invention mounted with a simplified depiction of a processing station 2 with which the manipulator 1 is used. The processing station 2 includes a body 3 in which a processing step is conducted. For instance, when articles to be processed are semiconductor wafers, the processing station 2 may operate to place a layer of photoresist on the surface of the wafer. Of course, many other processing steps may be accomplished.

Processing station 2 includes a canopy 4 which covers open parts of the body 3 of the processing station 2. The canopy 4 prevents particulate contamination inside the processing station 2. The manipulator 1 operates to remove a cassette 5 holding articles 6 to be processed from a container 7 that is supported on the processing station 2. The processing station 2 has a cassette port 8 for receiving the cassette 5 into the processing station 2. The cassette port 8 in the preferred embodiment is described in detail in the prior application entitled commonly assigned "BOX DOOR ACTUATED RETAINER" referred to above and incorporated by reference as if fully set forth herein.

The manipulator 1 comprises a shaft 10 extending from the cassette port 8 into the processing station 2. Preferably, the shaft 10 extends vertically down from the cassette port 8 so that gravity operates to lower the cassette 5 from the container 7 when the cassette port 8 is opened.

The manipulator 1 is described in detail with reference to FIGS. 2-6. The manipulator 1 includes the first means 20 for supporting the cassette 5 and transporting the cassette 5 along the shaft 10 through the cassette port 8 to and from the processing station 2. The first means includes the first platform 21 that is supported in the shaft 10. The cassette 5 is supportable on the first platform 21 so that when the cassette port 8 is opened, the cassette 5 rests on the first platform 12. In the preferred embodiment, a removable side of a container 7 is released when the cassette port 8 is opened and is supported on the first platform 21. The cassette 5 is supportable on top of the removable side of the container 7. An alignment pin 22 may be mounted on the first platform 21 or the removable side of container 7 to support the cassette 5, or other means for holding the cassette 5 on the platform 21 may be used. The first means 20 includes a means 23 for controllably moving the first platform 21 with the cassette 5 supportable thereon through the shaft 10 from adjacent the cassette port 8 to and from positions down to shaft 10. Thus the first platform 21 is movable up the shaft 10 to mate with and seal the cassette port 8. When the cassette port 8 opens, the cassette 5 is supported on the first platform 21. The first platform 21 may then be lowered along the shaft 10 into the processing station with the cassette 5 riding on it as described with reference to FIGS. 3-6.

The manipulator 1 further includes a second means 25 that is transportable through the shaft 10 for transporting the cassette 5 to and from at least one location 26 in at least partial alignment with the shaft 10 and inside the processing station 2 and for transporting the cassette 5 to and from the first means 20 when the first means is away from the cassette port 8. The second means 13 includes an orthogonal arm 27 or other support extending across and along a side of the shaft 10 so that the first means 20 can pass the orthogonal arm 27 in the shaft. An orthogonal arm is supported on its first end 28 by a means 29 for controllably positioning the orthogonal arm 27 within the shaft 10. The orthogonal arm 27 on its second end 30 supports a pivot arm 31 at pivot joint 90.

The pivot arm 31 includes a pivoting arm 32 at pivot joint 90 and an engaging end 33. The engaging end 33 includes means 34 operable to engage the cassette 5. The second means 25 further includes a means described with reference to FIG. 7 for controlling the position of the pivot arm 31 as it pivots about a plane orthogonal to the shaft 10.

The engaging means 34 on the engaging end 33 of the pivot arm 31 operates to engage the cassette 5 holding articles to be processed. The engaging means 34 is preferably pivotally mounted on the engaging end 33 of the pivot arm and includes means for maintaining the cassette 5 upright, such as a bearing allowing gravity to vertically align the cassette 5 while engage on engaging means 34 or an active system to maintain the alignment of the cassette.

In the preferred embodiment, a host elevator means 36 is mounted at the location 26 in alignment with the shaft 10 to receive the cassette 5. The host elevator means 36 includes a support platform 37 which is vertically positionable with a worm gear apparatus 45. Also, a conveyor 38 operates to lift the articles to be processed from the cassette 5 and transport them away from the host elevator means 36.

FIGS. 2-6 illustrate various positions of manipulator 1 as it transports a cassette 5 from within the container 7, to the elevator host means 36 in alignment with the shaft 10. Parts of the manipulator 1 shown in FIGS. 2-6 are labeled with consistent reference numbers when appropriate.

FIG. 2 shows manipulator 1 in a position for removing the cassette 5 from the container 7. The cassette 5 remains inside the container 7 on processing station 2. The first platform 21 of the first means 20 is positioned adjacent to cassette port 8 on the processing station 2. The second means 25 is positioned low in the shaft 10 allowing a large range of freedom of movement in the shaft 10 by the first means 20. When the cassette port 8 releases the cassette 5, the first platform 21 is lowered into the shaft 10 as shown in FIG. 3 with the cassette 5 supported thereon. The pivot arm 31 is swung into position so that the engaging means 34 engages the cassette 5 for lifting the cassette 5 off of the first platform 21.

As can be seen in FIG. 4, the pivot arm 31 is then pivoted to swing the cassette 5 to position outside the first platform 21 leaving room for the first platform to be repositioned adjacent to the cassette port 8.

As the first platform 21 rises to engage the cassette port 8, as shown in FIG. 5, the pivot arm 31 then swings the cassette 5 into position on the host elevator means 36. As shown in FIG. 6, the pivot arm 31 and the orthogonal arm 27 can then be positioned away from the cassette 5 holding articles to be processed which is supported on the host elevator means 36. The host elevator means operates to lower the cassette 5 so that articles, such as semiconductor wafers 39 can be removed from the cassette 5 by the conveyor 38. The conveyor then transports the articles into the processing station 2.

The manipulator 1 according to the present invention can be designed to utilize a minimum of space within the processing station 2. For a cassette 5 holding articles to be processed having a dimension of about 5 inches high by 4 inches wide, the entire manipulator 1 can be accomplished with a shaft of about 9 inches long, the pivot arm 31 of about 4¼ inches long from the pivot joint 90 to the engaging end 33. An orthogonal arm extending about 2 and ⅛ inches past the center line of the first platform 21 as indicated by the alignment pin 22. The range of pivoting motion of the pivot arm 31 thus is required to be 240 degrees. The cassette 5 will be engaged when the pivot arm is 30 degrees away from vertical toward the center of the shaft. Likewise the cassette 5 will be aligned in the center of the shaft when the pivot arm is 30 degrees away from vertical below the first platform 21 inside the shaft for alignment onto the host elevator means 36. These dimensions and angles are selected in the preferred embodiment to provide a clear range of motion for manipulating the cassette 5 while minimizing the amount of space necessary within the processing station 2 for the manipulator 1.

The host elevator means 36 includes a worm gear apparatus 45 for positioning the elevator platform 37. The worm gear apparatus 45 includes a threaded bar 46 and a bearing 47 which engages the threaded bar 46. The threaded bar 46 is threaded so that when turned by a motor (not shown) the position of the platform 37 is controlled.

As can be seen in FIGS. 2-6, the first means 20 and the second means 25 are supported on a guide means 50 for guiding the first means 20 and the second means 25 along the shaft 10. FIG. 8 shows a back view of a guide means 50 on which the first means 20 and second means 25 may be mounted. The guide means 50 includes a means 51 for controlling the position of the first platform 21 and means 52 for controlling the position of the orthogonal arm 27. The means 51 includes a worm gear apparatus 53 for controlling the position and two guides 54a, 54b providing alignment and stabilization for the first platform 21. A motor 55 controllably turns the threaded bar 56. Bearing 57 which mates with the threaded bar 56 thus operates to control the level of the first means 20. Bearings 58a and 58b operate to secure the first means 20 on the guide means 54a, 54b.

The means 52 likewise includes a worm gear apparatus 60 for controlling the position of the orthogonal arm 27 of the second means 25. The worm gear apparatus 60 includes a threaded bar 61 and a bearing 62 which mates the threaded bar 61. A motor 63 turns the threaded bar 61 to control the position of the second means 25. Bearings 64a, 64b operate to stabilize the second means 25 on guides 65a and 65b.

FIG. 7 illustrates the pivot joint 90 at the pivoting end 32 of the pivot arm 31 and at the second end 30 of the orthogonal arm 27. As can be seen in FIG. 7, a miniature drive chain 71 is journalled within the orthogonal arm 27. The miniature drive chain 71 engages a sprocket 72 which is mounted on the pivot arm 31. Pivot arm 31 is supported on bearings 73 so that as the drive chain 71 turns the sprocket 72, the angular position of the pivot arm 31 is controlled. A motor (now shown) at the second end 29 of the orthogonal arm 27 controls the miniature drive chain 71.

Journalled within the pivot arm 31 is another miniature drive chain 75 which engages a sprocket 76 that is mounted on the orthogonal arm 27. As the angular position of the pivot arm 31 changes with respect to the orthogonal arm 27, the miniature drive chain 75 translates the position of the pivot arm 31 to the engaging means 34 on the engaging end 31 of the pivot arm 31. This may be utilized to control the alignment of the engaging means 34 on the pivot arm 31 so that it maintains the cassette 5 upright.

The bearings 73 are sealed by a seal 79 to prevent an contamination in the processing station from the pivot joint 90. The sprocket 72 is supported on the pivot arm 31 by a screw 81. Likewise screw 82 supports the sprocket 76 on the orthogonal arm 27.

OPERATION

The orthogonal arm 27 has the pivot 90 located between the central axis X and the outer edge of the platform 21. Platform 21 has its edge offset an amount D from the central axis X as shown in FIGS. 2 and 4. The effective length, A, of the pivot arm 31 is such that when fully extended, the cassette 5 having a width, W is offset by an amount E away from the X axis. The offset E is greater than the protrusion, D, of the platform 21 from the X axis. In this manner, the platform 21 can be translated in either direction in a bypassing manner along the X axis so as to be either above or below the cassette 5.

As shown in FIG. 3, the arm 31 has been rotated to engage the top of the cassette 5 at a position where the platform 21 is offset a dimension C from the bottom of the port plate 8. In FIG. 4, the pivoting arm 31 has been rotated so that the container clears the offset D defining the end of the platform 21 so that the platform 21 bypasses the cassette 5 and operates to be returned as shown in FIG. 5 to close the port opening.

Also in FIG. 5, the arm 31 has been further rotated in the counter-clockwise direction so that the cassette 5 is again centered along the axis X, but this time below the platform 21. The movement of the container 5 as revealed in FIGS. 3, 4, and 5 demonstrates the ability of the present invention first to unload the cassette 5 which is centered on the X axis, second to offset the cassette 5 in a bypassing relation with platform 21 as shown in FIG. 4, and third to return the cassette 5 to the co-axial position as shown in FIG. 5.

The pivot 90 located between the axis X and the D offset from the axis at the end of platform 21 (coupled with the effective length A of the pivot arm 31) provides a mechanism which minimizes the height F required in order to have the co-axial loading and unloading, in a bypassing relationship, with platform 21. The present invention is, therefore, particularly useful in minimizing the amount of height F required in which to co-axially unload a cassette 5 from the container 7. This feature is particularly useful when the present invention is adapted to processing apparatus in a clean room environment where the dimension F needs to be as small as possible.

In summary, disclosed is a manipulator 1 for removing a cassette 5 holding articles, such as semiconductor wafers, to be processed from a container 7 supported on a processing station 2 in a standard mechanical interface (SMIF) system. The container is supported on an interface cassette port on the canopy of the processing station. The first platform transportable along a shaft below the cassette port is operable to mate with the cassette port and receive the cassette from the container. The first platform is transported down the shaft, thereby removing the cassette from the container. An orthogonal arm mounted along a side of the shaft includes a pivoting arm which swings to engage the cassette on the first platform and support the cassette off of the first platform. The pivot arm then transports the cassette away from an area above the first platform allowing the first platform to move back in bypassing relationship up the shaft to seal the cassette port. The cassette is then positioned, by the pivot arm and the orthogonal arm, on a host elevator located at the bottom of the shaft. The manipulator according to the present invention occupies a small vertical space within a processing station.

While the invention has been particularly shown and described with reference to preferred embodiments thereof, it will be understood by those skilled in the art that the foregoing and other changes in form and detail may be made therein without departing from the spirit and scope of the invention.

I claim:

1. An apparatus for transferring a cassette holding articles to be processed to and from a container supported at a processing station where the processing station has a cassette port for receiving the cassette when the cassette moves along a central axis extending from outside the processing station, through the cassette port, and into the processing station, said apparatus comprising:

platform means including a platform transportable substantially along the central axis for transferring the cassette to and from the container substantially along the central axis, the platform means including a first side and a second side, the cassette being supportable on the first side;

manipulator means including a first arm extending substantially orthogonal to the central axis, the first arm including a first end and a second end;

means, mounted adjacent to the first end of the first arm, for controlling the axial position of the first arm relative to the central axis;

a pivoting arm including a pivoting end and an engaging end, the pivoting end mounted pivotally adjacent to the second end of the first arm, the pivoting arm operable to pivot about a pivot axis extending substantially through the pivoting end and substantially perpendicular to the central axis;

engaging means mounted on said engaging end of the pivoting arm for engaging the cassette;

means for controlling the axial position of the platform relative the central axis; and means for controlling the rotational position of the pivoting arm.

2. The apparatus of claim 1 wherein said platform means further includes host elevator means attached to said platform for positioning the platform and the cassette along the central axis.

3. The apparatus of claim 1, wherein said engaging means further includes means for maintaining the cassette upright on said engaging means.

4. The apparatus of claim 1, wherein said articles to be processed include semiconductor wafers.

5. The apparatus of claim 1, wherein said first platform is adapted to seal the cassette port when positioned adjacent the cassette port.

6. The apparatus of claim 1, wherein:

the means for controlling the axial position of the first arm includes a first worm gear apparatus; and the means for controlling the axial position of the platform includes a second worm gear apparatus.

7. In a standard mechanical interface system, an apparatus for transferring a cassette holding articles to be processed to and from a container supported on a processing station, the processing station having a cassette port for receiving the cassette, said apparatus comprising;

a shaft extending along a first axis from the cassette port on the processing station into the processing station;

a first platform supported in said shaft having a first side facing the cassette port, the cassette being supportable on said first side of said first platform;

means for controlling the axial position of said first platform with the cassette supportable thereon relative to said first axis in said shaft;

a first arm extending substantially orthogonally across said shaft and movable along said shaft, said first arm having a first end and a second end;

means mounted adjacent to said second end of said first arm, for controlling the axial position of said first arm in said shaft;

a pivoting arm having a pivoting end and an engaging end, said pivoting end mounted pivotally adjacent to said second end of said first arm and operable to pivot about a pivot axis extending substantially through the pivoting end and substantially perpendicular to the first axis;

engaging means mounted on said engaging end of said pivoting arm for engaging the cassette;

host elevator means mounted in said shaft for positioning the cassette holding articles to be processed inside the provessing station; and means for controlling the rotational position of said pivoting arm for transporting the cassette to and from said first side of said first platform and to and from said host elevator means.

8. The apparatus of claim 7, wherein the cassette is supported upright on said first platform and said engaging means further includes:

means for maintaining the cassette upright while engaged on said engaging means.

9. The apparatus of claim 7, wherein said articles to be processed include semiconductor material.

10. The apparatus of claim 7, wherein said first platform is adapted to seal the cassette port when positioned adjacent the cassette port.

11. The apparatus of claim 7, wherein
said means for controlling the position of said first platform includes a worm gear apparatus;
said means for controlling the position of said first arm includes a second worm gear apparatus.

12. The apparatus of claim 1 wherein the pivot axis extends substantially perpendicular to the first arm.

13. The apparatus of claim 1 wherein said pivoting arm can rotate about the pivot axis to a first rotational position in which the cassette, when supported by the first side of said platform, can substantially bypass said engaging means when the platform is transported substantially along the central axis.

14. The apparatus of claim 13 wherein said pivoting arm can rotate about the pivot axis to a second rotational position in which said engaging means is disposed between the cassette port and the first arm and in which said engaging means can engage the cassette when the cassette is supported by the first side of the platform outside the container.

15. The apparatus of claim 14 wherein said pivoting arm can rotate about the pivot axis to a third rotational position in which the first arm is disposed between the cassette port and said engaging means and in which said engaging means can engage the cassette.

16. The apparatus of claim 15 wherein said means for controlling the axial position of the platform causes the platform to be disposed closer to the cassette port when said pivoting arm is in the third rotational position than when said pivoting arm is in the second rotational position.

17. The apparatus of claim 16 wherein said means for controlling the axial position of the first arm causes the first arm to be disposed closer to the cassette port when the pivoting arm is in the third rotational position than when the pivoting arm is in the second rotational position.

18. The apparatus of claim 17 wherein the cassette is disposed substantially coaxially with the cassette port when said pivoting arm is in either the second rotational position or the third rotational position and the engaging means engages the cassette.

19. The apparatus of claim 18 wherein the pivoting arm can rotate through an arc of between approximately 180° and 270° between the second rotational position and the third rotational position while said engaging means engages the cassette; and
wherein the pivoting arm has a length dimension long enough for the cassette to bypass the platform while the pivoting arm rotates through the arc.

20. The apparatus of claim 19 wherein the arc is approximately 240°.

* * * * *